(12) United States Patent
Woo et al.

(10) Patent No.: US 6,590,288 B1
(45) Date of Patent: Jul. 8, 2003

(54) SELECTIVE DEPOSITION IN INTEGRATED CIRCUIT INTERCONNECTS

(75) Inventors: Christy Mei-Chu Woo, Cupertino, CA (US); Pin-Chin Connie Wang, Menlo Park, CA (US); Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/874,549

(22) Filed: Jun. 4, 2001

(51) Int. Cl.[7] .................... H01L 23/48; H01L 23/52; H01L 29/40
(52) U.S. Cl. ............... 257/751; 257/758; 257/759; 257/762; 438/637; 438/700
(58) Field of Search .................. 257/758, 768, 257/769, 770, 774

(56) References Cited

U.S. PATENT DOCUMENTS 5,824,599 A * 10/1998 Schacham-Diamand et al. . 438/678
6,168,991 B1 * 1/2001 Choi et al. .................. 435/254

* cited by examiner

*Primary Examiner*—Dung Anh Le
(74) *Attorney, Agent, or Firm*—Mikio Ishimaru

(57) ABSTRACT

An integrated circuit and manufacturing method therefor is provided having a semiconductor substrate with a semiconductor device. A first conductor core is connected to the semiconductor device. A low dielectric constant dielectric layer is formed over the semiconductor substrate and has an opening formed therein. A first barrier layer is deposited over the first conductor core. A second barrier layer is deposited to line the low dielectric constant dielectric layer and the first barrier layer. A third barrier layer is deposited to line the second barrier layer. A second conductor core is deposited to fill the opening over the third barrier layer.

9 Claims, 2 Drawing Sheets

SELECTIVE DEPOSITION IN INTEGRATED CIRCUIT INTERCONNECTS

TECHNICAL FIELD

The present invention relates generally to semiconductor technology and more specifically to relaxing the process window for barrier layer deposition in integrated circuits interconnects.

BACKGROUND ART

In the manufacture of integrated circuits, after the individual devices such as the transistors have been fabricated in and on a semiconductor substrate or wafer, they must be connected, or "wired", together to perform the desired circuit functions. This interconnection process is generally called "metallization" and is performed using a number of different photolithographic, deposition, and removal processes to create contacts to the transistors, wire/ channels to the contacts, and vias interconnecting the channels where there are more than one level of channels.

There are a number of different metalization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed over the first channel stop layer. Where the first channel dielectric layer is of an oxide material, such as silicon oxide ($SiO_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited over the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide and silicon nitride. This diffusion can result in a conductive buildup and cause short circuits in the integrated circuits. To prevent diffusion, a diffusion barrier is deposited over the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited over the barrier layer and lines the barrier layer in the first channel openings to act as an electrode for the electroplating process. Processes such as electroless, physical vapor, and chemical vapor deposition are used to deposit the seed layer.

A first conductor material is electroplated over the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first channel dielectric layer so the materials and layers are coplanar with the dielectric layer. The CMP process leaves the first conductor "inlaid" in the first channel dielectric layer to form the first channels. When a thing dielectric layer is placed over the first channels as a final layer, it is called a "capping" layer and the single damascene process is completed. When the layer is processed further for placement of additional channels over it, the layer is a via stop layer.

In another technique called the "dual damascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed over the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped.

A second channel dielectric layer is formed over the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited over the second channel dielectric layer and lines the second channel and the via openings.

A barrier layer is then deposited over the adhesion layer and lines the adhesion layer in the second channel openings and the vias.

Again, for conductor materials such as copper and copper alloys, a seed layer is deposited over the barrier layer and lines the barrier layer in the second channel openings and the vias.

A second conductor material is electroplated over the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which are very difficult to etch.

A major problem occurs at the interface between the barrier layers and the dielectric layers, and also at the interface between the barrier layer and the conductor core. Generally, one barrier material, or a nitride or carbide variation of the same barrier material is used in the barrier layer. For example, tantalum, or tantalum nitride, or a combination of tantalum and tantalum nitride may be used. With low dielectric constant dielectric materials, barrier materials having a good interface with the dielectric layer often have poor interfaces with the conductor core material and vice versa.

Solutions to this problem have been long sought but have long eluded those skilled in the art.

DISCLOSURE OF THE INVENTION

The present invention provides an integrated circuit and manufacturing method therefor having a semiconductor substrate with a semiconductor device. A first conductor core is connected to the semiconductor device. A low dielectric constant dielectric layer is formed over the semiconductor substrate and has an opening formed therein. A first barrier layer is deposited over the first conductor core. A second barrier layer is deposited to line the low dielectric constant dielectric layer and the first barrier layer. A third barrier layer is deposited to line the second barrier layer. A second conductor core is deposited to fill the opening over the third barrier layer. This results in good interface adhesion between the barrier layer and the dielectric layer, and the barrier layer and the conductor core while relaxing the process window for barrier deposition.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
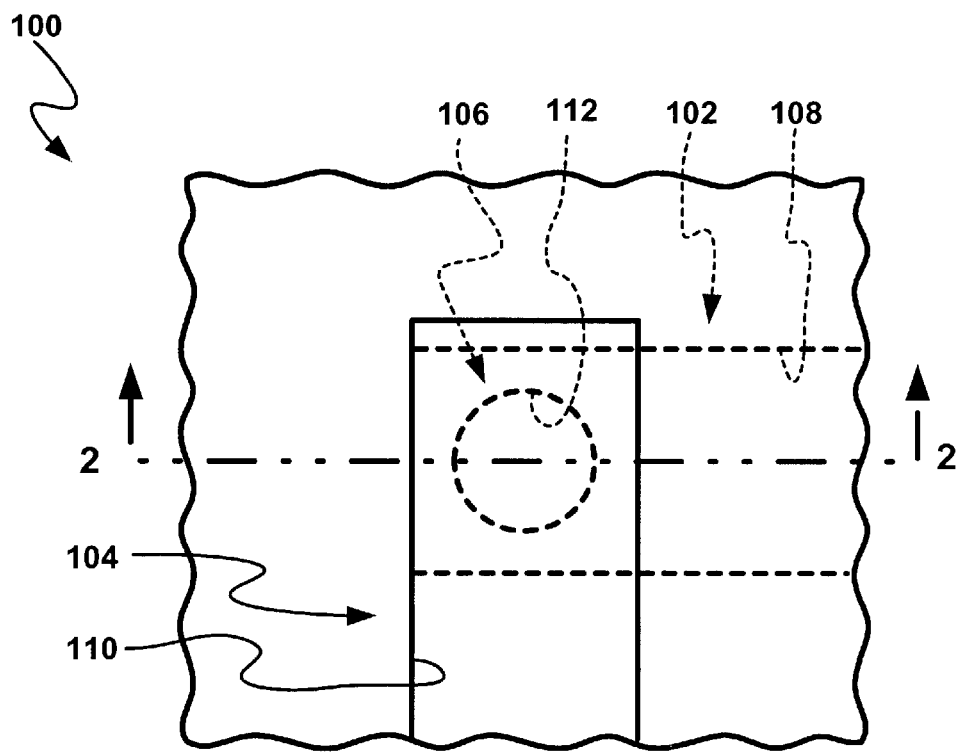
FIG. 1 (PRIOR ART) is a plan view of aligned channels with a connecting via.

Referring now to FIG. 1 (PRIOR ART), therein is shown a plan view of a semiconductor wafer 100 including a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
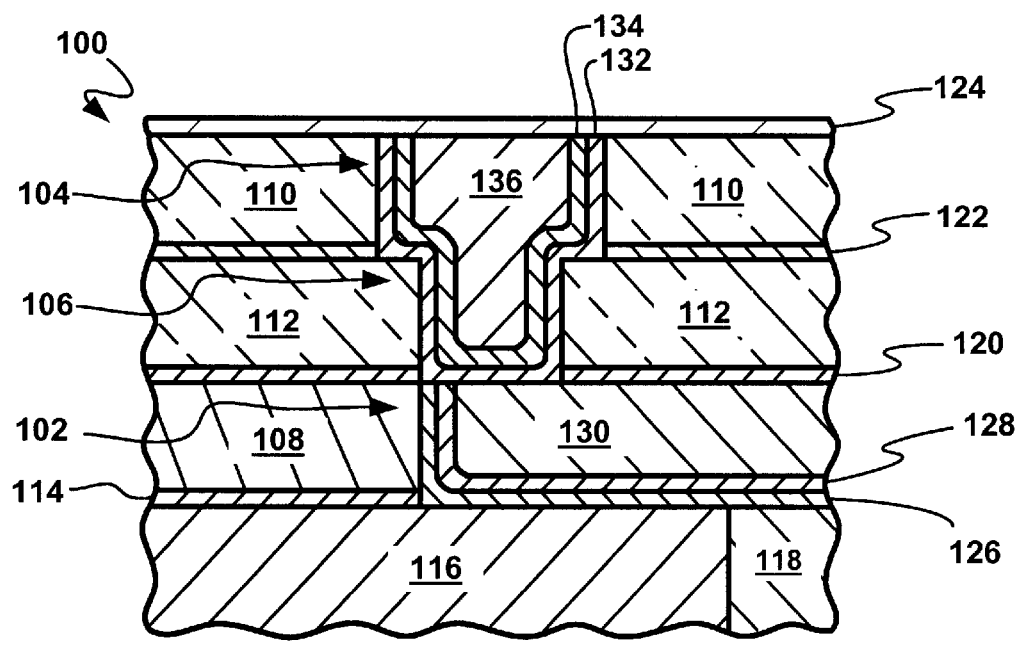
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is over a device dielectric layer 116, which is over the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or via stop layer 124.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes over which the conductor material of the conductor cores 130 and 136 is deposited. The seed layers 128 and 134 are of substantially the same conductor material as the conductor cores 130 and 136 and become part of the respective conductor cores 130 and 136 after the deposition.

The major problem occurs at the interface between the barrier layers and the dielectric layers, and also at the interface between the barrier layer and the conductor core. Generally, one barrier material, or a nitride or carbide variation of the same barrier material is used in the barrier layer. For example, tantalum, or tantalum nitride, or a combination of tantalum and tantalum nitride may be used. With low dielectric constant dielectric materials, barrier materials having a good interface with the dielectric layer often have poor interfaces with the conductor core material and vice versa.

Figure 3:
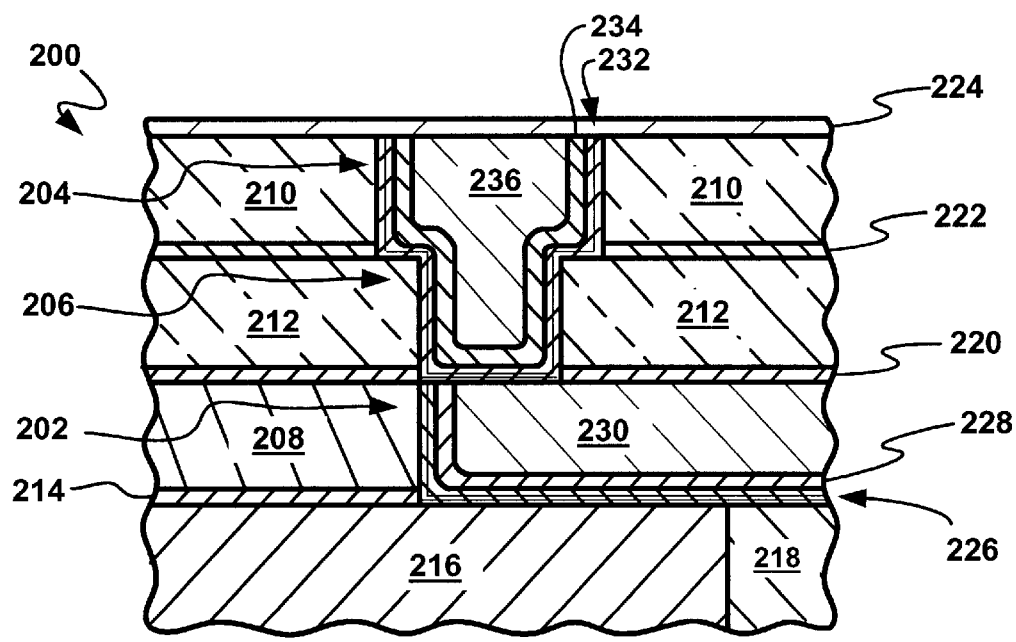
FIG. 3 is a cross-section of a semiconductor wafer similar to that shown in FIG. 2 (PRIOR ART) incorporating the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is over a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a compound barrier layer 226 and a seed layer 228 around a conductor core 230. The second channel 204 and the via 206 include a compound barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes over which the conductor material of the conductor cores 230 and 236 is deposited. The seed layers 228 and 234 are of substantially the same conductor material of the conductor cores 230 and 236 and become part of the respective conductor cores 230 and 236 after the deposition.

Figure 4:
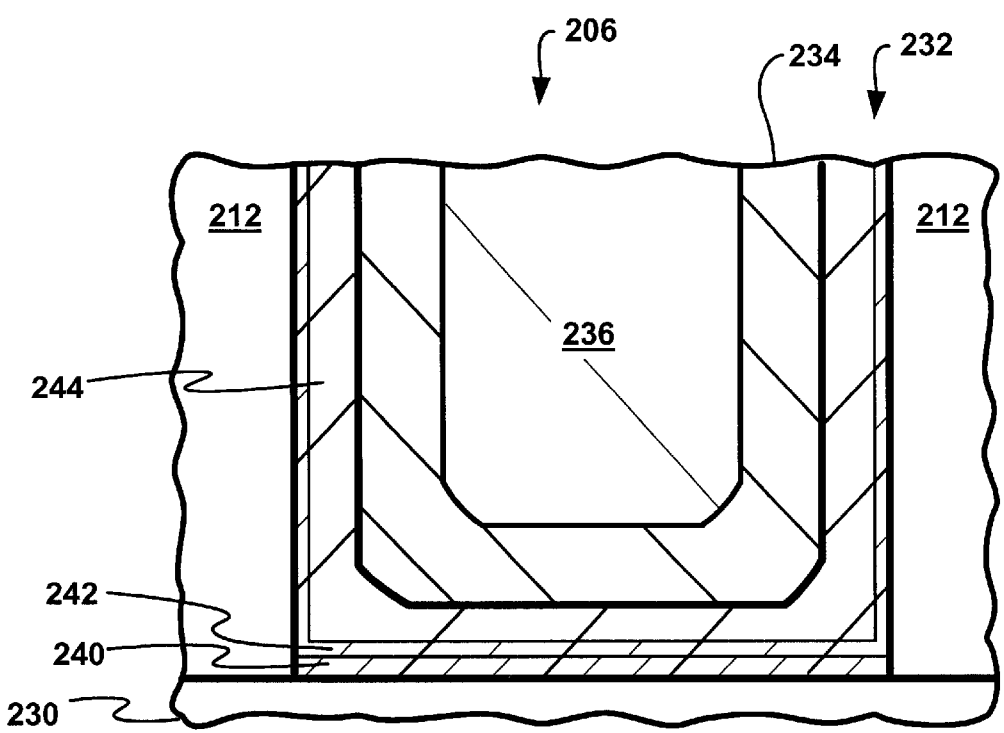
FIG. 4 is a close-up view of the bottom portion of the via shown in FIG. 3 showing the present invention.

Referring now to FIG. 4, therein is shown a close-up view of the bottom portion of the via 206. A first barrier layer 240 is shown deposited over the conductor core 230 at the bottom of the via 206. A second barrier layer 242 is shown deposited over the first barrier layer 240 and over the sidewalls of the via dielectric layer 212. The first and second barrier layers 240 and 242 are of different barrier materials with different metal compositions. A third barrier layer 244 is deposited over the second barrier layer 242. Taken together, the first, second, and third barrier layers 240, 242, and 244 make up the barrier layer 232. The process flow of the present invention starts with the deposition of the first barrier layer 240 by a process which will only place the barrier layer 240 at the bottom of the via 206. An example of such a process is selective chemical vapor deposition of a material such as tungsten. Tungsten has good adhesion to the underlying conductor core 230 when it is of copper. A very thin layer of the second barrier layer 242 is deposited by a process which forms a thin layer (from 10Å–50Å). An example of such a process is atomic layer chemical vapor deposition (ALCVD), which forms a good interface with dielectric materials such as in the dielectric layer 212. It has unexpected found that it provides an even better interface with low dielectric constant dielectric materials. ALCVD materials include TiN, TaN, WN, TiSiN, TaSiN, and WSiN. After deposition of the second barrier layer 242, a conventional barrier layer can be deposited to form the third barrier layer 244, such barrier materials being tantalum or tantalum nitride to give good step coverage or to provide a good wetting layer for the seed layer 234.

In various embodiments, the diffusion barrier layers are of materials such as tantalum (Ta), titanium (Ti), tungsten (W), alloys thereof, and compounds thereof. The adhesion layers are of materials such as tantalum nitride (TaN), titanium nitride (TiN), tungsten nitride (WN), and compounds thereof. The seed layers (where used) are of materials such as copper (Cu), gold (Au), silver (Ag), compounds thereof and combinations thereof with one or more of the above elements. The conductor cores with or without seed layers are of conductor materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), SOP (trimethylsilil phosphate), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon;
   a first conductor core connected to the semiconductor device;
   a dielectric layer over the semiconductor substrate, the dielectric layer having an opening provided therein;
   a barrier layer lining the opening, including:
      a first barrier layer over the first conductor core only in the bottom of the opening,
      a second barrier layer lining the dielectric layer and the first barrier layer, and
      a third barrier layer lining the second barrier layer; and
   a second conductor core to fill the opening over the third barrier layer.

2. The integrated circuit as claimed in claim 1 wherein the barrier layer includes materials from a group consisting of tantalum, titanium, tungsten, alloys thereof, and compounds thereof.

3. The integrated circuit as claimed in claim 1 wherein the second conductor core is a material from a group consisting of copper, aluminum, gold, silver, a compound thereof, and a combination thereof.

4. The integrated circuit as claimed in claim 1 wherein the dielectric layer is a material from a group consisting of fluorinated tetraethoxysilane (FTEOS), hydrogen silsesquioxane (HSQ), benzocyclobutene (BCB), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), and SOP (trimethylsilil phosphate) with dielectric constants below 3.9.

5. An integrated circuit comprising:
   a semiconductor substrate having a semiconductor device provided thereon;
   a first conductor core connected to the semiconductor device;
   a low dielectric constant dielectric layer over the semiconductor substrate, the low dielectric constant dielectric layer having an opening provided herein;
   a barrier layer lining the opening, including:
      a first barrier layer over the first conductor core only in the bottom of the opening, a second barrier layer lining the low dielectric constant dielectric layer and the first barrier layer, and a third barrier layer lining the second barrier layer;

a second conductor core filling the opening over the third barrier layer; and the second and third barrier layers and the second conductor core co-planar with the low dielectric constant dielectric layer.

6. The integrated circuit as claimed in claim 5 wherein the barrier layer includes materials from a group consisting of tantalum, titanium, tungsten, alloys thereof, and compounds thereof.

7. The integrated circuit as claimed in claim 5 wherein the second barrier layer uses a material selected from a group consisting of titanium, tantalum, tungsten, an alloy thereof, a silicon compound thereof, and a nitride compound thereof.

8. The integrated circuit as claimed in claim 5 wherein the second conductor core is a material from a group consisting of copper, aluminum, gold, silver, a compound thereof, and a combination thereof.

9. The integrated circuit as claimed in claim 5 wherein the low dielectric constant dielectric layer is a material from a group consisting of fluorinated tetraethoxysilane (FTEOS), hydrogen silsesquioxane (HSQ), benzocyclobutene (BCB), TMOS (tetramethoxysilane), OMCTS (octamethyleyclotetrasiloxane), HMDS (hexamethyldisiloxane), SOB (trimethylsilil borxle), DADBS (diaceloxyditerliarybutoxsilane), and SOP (trimethylsilil phosphate) with dielectric constants below 3.9.

* * * * *